United States Patent [19]

Clarisse

[11] 4,043,207
[45] Aug. 23, 1977

[54] FREQUENCY SELECTOR COMPRISING A FREEWHEEL COUPLING

[75] Inventor: Eddy Johan Clarisse, Eindhoven, Netherlands

[73] Assignee: U.S. Philips Corporation, New York, N.Y.

[21] Appl. No.: 620,297

[22] Filed: Oct. 7, 1975

[30] Foreign Application Priority Data

Oct. 14, 1974 Netherlands .......................... 7413449

[51] Int. Cl.² .......................... F16H 35/18; H03J 5/02
[52] U.S. Cl. .................................. 74/10.15; 74/10 R; 74/826; 334/49; 334/51
[58] Field of Search ................. 74/10.15, 10 R, 10.20, 74/826; 334/49, 50, 51

[56] References Cited

U.S. PATENT DOCUMENTS

| 2,942,108 | 6/1960 | Goldstein et al. ..................... 334/49 |
| 3,022,674 | 2/1962 | Cross et al. ............................ 334/51 |
| 3,192,494 | 6/1965 | Carlson et al. ........................ 334/51 |
| 3,459,055 | 8/1969 | Sperber ................................ 74/10.15 |
| 3,601,722 | 8/1971 | Rolf .................................... 74/10.15 |

FOREIGN PATENT DOCUMENTS

| 1,306,437 | 2/1973 | United Kingdom ............... 74/10.15 |
| 937,812 | 9/1963 | United Kingdom ............... 74/10.54 |

Primary Examiner—Samuel Scott
Assistant Examiner—Randall Heald
Attorney, Agent, or Firm—Frank R. Trifari; David R. Treacy

[57] ABSTRACT

A frequency selector comprising a first control member for frequency preselection changing and a second control member for changing the preselection frequency. The control members are coupled such that unintended changing of the preselection frequency by touching the second control member is prevented.

6 Claims, 3 Drawing Figures

FREQUENCY SELECTOR COMPRISING A FREEWHEEL COUPLING

The invention relates to a frequency selector, comprising a tuning member with preselection facility including a turret which can be step-wise rotated and a coupling member which is connected to tuning means and which can be displaced by means of axially adjustable abutment screws provided on the turret, and also comprising a first control member which is slidable under spring force along a shaft which is parallel to the turret shaft and which — by way of a crank pin which intermittently engages a profile provided on the turret — intermittently rotates the turret, the said tuning member furthermore comprising a second control member which is provided with an adjusting gearwheel which cooperates, in a first position, with one of the toothed adjusting nuts provided on each of the abutment screws.

In a known frequency selector of the kind set forth (British patent specification No. 1,306,437), the first control member for changing the preselection is coupled, by way of an extension, to the second control member for fine tuning. When the first control member is depressed, the adjusting gearwheel each time disengages from the adjustable abutment screws present on the turret. The adjusting gearwheel, however, always engages one of the abutment screws again after the return of the first control member to the neutral position.

It is a drawback of such a frequency selector that accidental and/or unintended rotation of the second control member in the neutral position of the two control members causes a change of the preselection frequency associated with a given abutment screw. Therefore, for the advantages of the preselection to be utilized, it is necessary not to touch the second control member, unless the preselection is to be changed.

The invention has for its object to provide a frequency selector wherein the risk of unintended changing of the preselection is substantially reduced.

To this end, a frequency selector according to the invention is characterized in that the second control member can be slid from the first stable position, by means of a catching member connected to the first control member, to a second stable position wherein the adjusting gearwheel does not engage the adjusting nuts; and the adjusting gearwheel can be slid from the second stable position to the first stable position by means of the second control member, while the first control member remains in the stationary condition.

A particularly simple frequency selector which can be inexpensively manufactured according to the invention is furthermore characterized in that the second control member comprises a tuning shaft or button rod which can be slid parallel to the turret shaft. The shaft is provided with a detent arrangement comprising a first circumferential groove which corresponds to the first stable position of the second control member and with a second circumferential groove which corresponds to the second stable position of the second control member, the circumferential grooves cooperating with a wire spring which is secured to the frame of the selector and which extends mainly in a plane transverse to the tuning rod, the wire spring engaging the first circumferential groove in the first stable position of the tuning rod and engaging the second circumferential groove in the second stable position of the tuning rod.

A special embodiment of a frequency selector according to the invention will be described in detail hereinafter with reference to a drawing.

Figure 1:
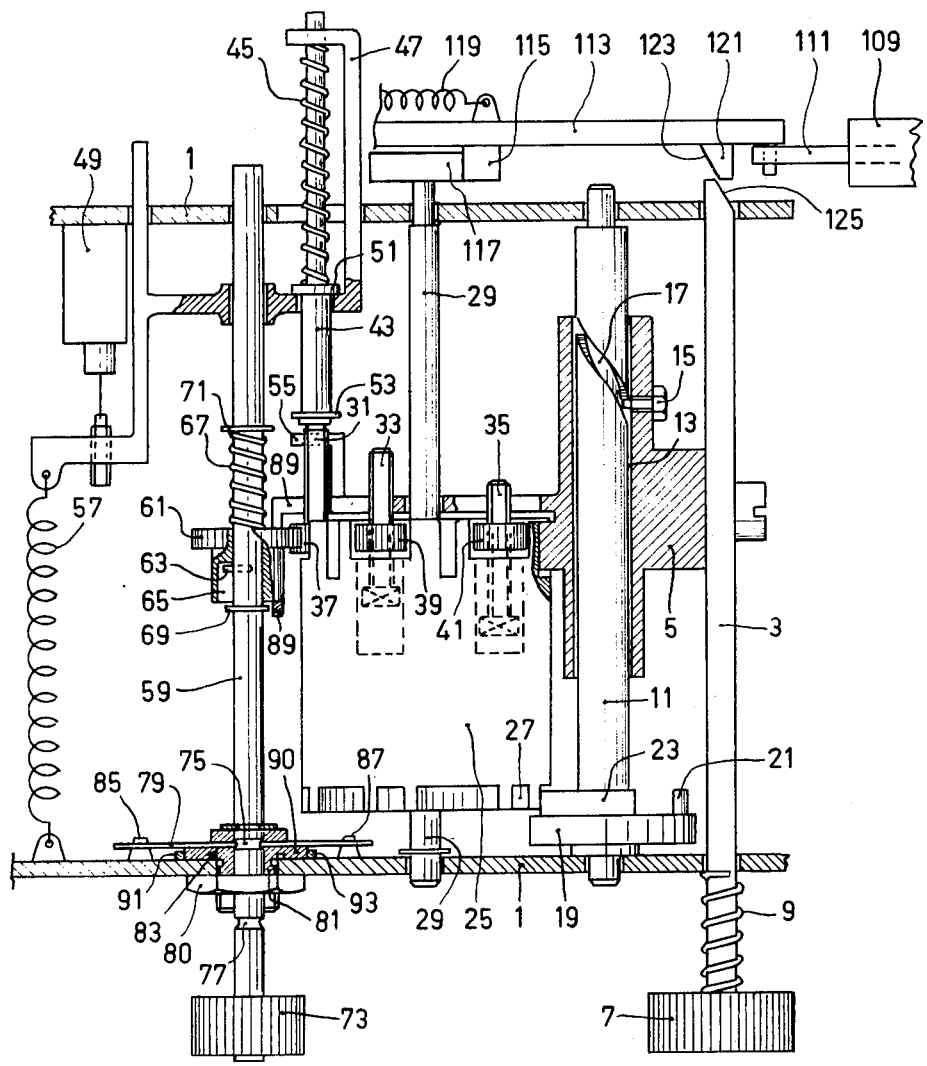
FIG. 1 is a horizontal section view of a portion of the frequency selector.

The frequency selector shown in FIG. 1 comprises a first control member which comprises a button rod 3 which is slidable in a frame 1 and whereto a slide 5 is connected. The button rod 3 is provided with a control knob 7. A reset spring 9 is arranged about the button rod 3 between the frame 1 and the control knob 7. A spindle 11 which extends parallel to the button rod 3 is rotatably journalled in the frame 1. The spindle 11 extends through a bore 13 in the slide 5 which can be slid along the spindle by pressing the control knob 7. The slide 5 is provided with a drive pin 15 which is directed towards the center of the bore 13 and which co-operates with a helical groove 17 provided in the spindle 11. When the control knob 7 is depressed, the translatory movement of the button rod 3 is converted into a rotation of the spindle 11 about the longitudinal axis of the spindle 11 by means of the drive pin 15 and the groove 17, while slide 5 slides over the spindle 11. On the spindle 11 there is provided a disc 19 having a crank pin 21 which is eccentrically arranged with respect to the spindle axis, and also a disc-shaped shoulder 23 which is situated diametrically opposite the crank pin 21. During a complete rotation of the spindle 11, the crank pin 21 cooperates for a comparatively short period of time with a slot-shaped profile 27 provided on a rotatable turret 25. The turret 25 is secured on a shaft 29 which is parallel to the spindle 11 and which is rotatable in the frame 1. The groove 17 in the spindle 11 is proportioned such that, during one operating cycle consisting of a forward and a return stroke of the control knob 7, one complete rotation of the spindle 11, and hence of the crank pin 21, takes place. The profile 27 on the turret 25 is during such that during one complete rotation of the crank pin 21, the turret is rotated through one sixth of a complete rotation. A complete rotation of the turret 25, therefore, is achieved only after the control knob 7 has been depressed six times.

The turret 25 is provided with six abutment screws which are equidistantly arranged along a circle circumference. Only the abutment screws 31, 33 and 35 are visible in FIG. 1. The abutment screws, 31, 33 and 35, which are provided with a fine thread are axially adjustable by means of axially located rotatable adjusting nuts, 37, 39 and 41, provided with external teeth. The abutment screws, 31, 33 and 35, are locked against rotation in the turret 25. The manner in which the adjusting nuts are turned will be described in detail hereinafter. By step-wise rotation of the turret 25, each of the abutment screws can be moved to the position occupied by the abutment screw 31 in FIG. 1. In that position the free end of the relevant abutment screw 31 cooperates with a feeler rod 43 which is slidable parallel to the turret shaft 29. The feeler rod 43 is maintained, by means of a compression spring 45, in its position shown in FIG. 1 in a bracket 47 which is slidable in a direction parallel to the turret shaft 29. The bracket 47 is coupled to a tuning device or member 49 for fine tuning, for example, in the form of a coil accommodating a slidable core. The feeler rod 43 is provided with a shoulder 51 which is pressed against the bracket 47 by the spring 45. The rod 43 also comprises a second shoulder 53 which is provided near its end facing the turret 25. The shoulder 53 co-operates with a pressure arm 55 connected to the slide. Each time when the control knob 7 is depressed, the feeler rod 43 is briefly moved away from the turret 25 by the pressure arm 55, with the result that the rod 43 remains disengaged from the abutment screws on the step-wise rotating turret 25. The bracket 47 is slid against the force of a spring 57. The spring 45 is stronger than the spring 57, so that when the abutment screw 31 is axially displaced, the rod 43 cannot freely move with respect to the bracket 47. The distance between the free end of the abutment screws 31, 33 and 35 and the turret 25 each time defines a rest position of the rod 43 and also a given position of the tuning member 49 coupled to the rod 43. Each of the six abutment screws in the turret 25 corresponds to a defined position of the tuning member 49, and hence to a preselected frequency. Hereinafter it will be described how the preselected frequency, for example, a radio or television frequency, can be adjusted.

A second control member or tuning shaft 59 is rotatably journalled in the frame 1, the said shaft also being slidable in a direction parallel to the drum shaft 29. An adjusting gearwheel 61 is arranged on the tuning shaft 59. The gearwheel 61 is locked against rotation with respect to the tuning shaft 59 by means of a locking pin 63 which is pressed into the tuning shaft and which engages a slot 65 which axially extends in the gearwheel 61. The gearwheel 61 is pressed against a shoulder 69 formed on the tuning shaft by a comparatively lightly biased compression spring 67 located between the gearwheel 61 and a further shoulder 71 provided on the tuning shaft. The tuning shaft can be rotated and slid by means of a control knob 73. An abutment screw situated in line with the rod 43 — the abutment screw 31 in the case shown — is adjusted by rotating the control knob 73. The rotating gearwheel 61 then engages the teeth of the adjusting nut 37. Because the adjusting nut 37 is axially located in the turret 25, the abutment screw 31 is displaced in the axial direction when the nut rotates. The preselection tuning frequency associated with the abutment screw 31 is thus changed. Each of the six abutment screws can thus be assigned its own preselected tuning frequency.

The tuning shaft 59 is provided with two circumferential detent grooves 75 and 77 which are situated at some distance from each other and each of which co-operates with a wire spring 79 secured to the frame 1 in a given axial position of the tuning shaft. A threaded bushing 81 is secured in an opening in the frame 1 by means of a nut 80, the tuning shaft 59 being inserted through the threaded bushing. The threaded bushing 81 is provided with a transverse slot 83 through which the central portion of the wire spring 79 passes (see also FIGS. 2 and 3). On the frame 1 tags 85 and 87 are formed which are situated one on each side of the tuning shaft 59 and which are directed slightly upwards (in FIG. 1). The free ends of the wire spring are hooked behind the tags 85 and 87. The position of the tags 85 and 87 and the transverse slot 83 with respect to each other (viewed in a plane through the wire spring and transverse to the tuning shaft) and the depth of the transverse slot 83 (see FIG. 2) are chosen such that, during the engagement of one of the circumferential grooves 75 and 77 by the wire spring 79, this spring is lightly biased against the bottom of the relevant circumferential groove. The bias of the wire spring 79 is such that, when the gearwheel 61 does not engage one of the adjusting nuts and the spring 67 is depressed, the tuning shaft 59 is not displaced. The manner in which the tuning shaft 59 is axially displaced when the frequency selector is in operation will be described in detail hereinafter.

The slide 5 which is connected to the button rod 3 is provided with a catching member 89 which engages behind the tuning gearwheel 61 in the first stable position shown. In the operating position shown in FIG. 1, the preselection of the selector is adjusted to the tuning frequency corresponding to the abutment screw 31. It is assumed that the user intends to leave the position shown for an other preselection (abutment screw). To this end, the control knob 7 is depressed against the force of the spring 9 and is released again. The turret 25 is thus rotated through one step in the described manner, with the result that the feeler rod 43 then presses against the abutment screw 33. During the depression of the control knob 7, the catching member 89 causes the adjusting gearwheel 61 to disengage from the adjusting unit 37, and also displaces the entire tuning shaft over a distance equal to the center-to-center distance of the circumferential grooves 75 and 77 on the tuning shaft 59. The wire spring 79 which initially engaged the circumferential groove 75 thus engages the circumferential groove 77 and retains the tuning shaft 59 in the second stable position corresponding to the latter groove, while the button rod 3 returns to its neutral position. During each subsequent change of the preselection frequency (abutment screw) the tuning shaft 59 remains in the second stable position. Accidental and/or unintended touching of the control knob 73 is thus prevented from changing a preselection frequency associated with a given abutment screw. If the preselection frequency corresponding to the abutment screw 33 is to be changed, the procedure is as follows. When the control knob 73 is pulled, the second control member or tuning shaft 59 is returned to the first stable position wherein the wire spring 79 engages the circumferential groove 75. The tuning gearwheel 61 then engages the adjusting nut 39 of the abutment screw 33. The preselection frequency corresponding to the abutment screw 33 can be changed by rotating the control knob 73. If the teeth of the gearwheel 61 do not engage the teeth of the adjusting nut 39 when the tuning shaft 59 returns to the position corresponding to the circumferential groove 75, the spring 67 is slightly depressed. A slight rotation of the control knob 73 then causes the adjusting gearwheel 61 to engage the adjusting nut 39.

Figure 2:
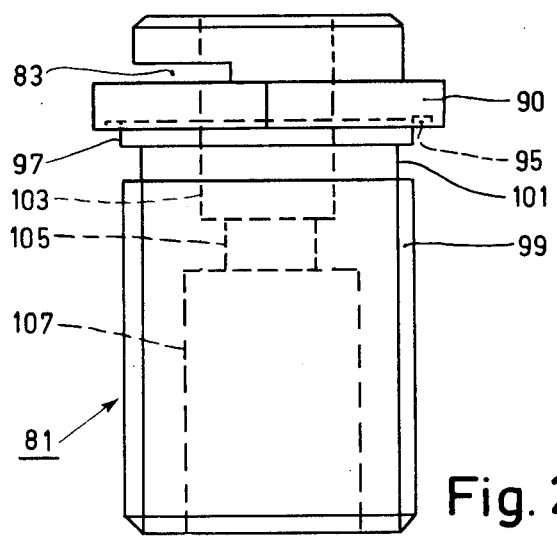
FIG. 2 is a detailed longitudinal sectional view at an increased scale of a threaded bush shown in FIG. 1.
Figure 3:
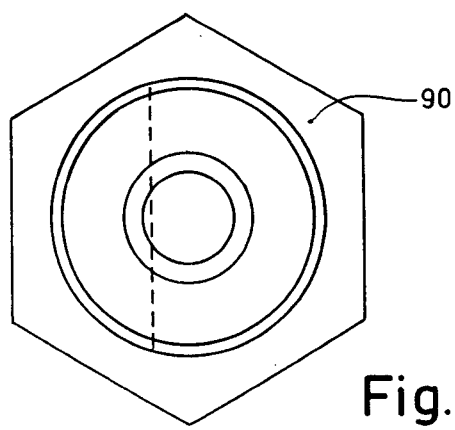
FIG. 3 is a side elevation of the threaded bush shown in FIG. 2.

The threaded bushing 81 is preferably constructed as shown in the FIGS. 2 and 3. Near its end which is situated inside the frame 1 (see also FIG. 1), the bushing 81 is provided with a hexagon 90 which also forms a shoulder which is screwed against the frame 1. The threaded bushing is locked against rotation by means of two cams 91 and 93 which are formed on the frame 1 and which are situated one on each side of the tuning shaft 59. The cams 91 and 93 are symmetrically arranged with respect to the tuning shaft 59. As has already been stated, the bushing 81 is provided with a slot 83 wherein the wire spring 79 is situated. The hexagon 90 is provided with a circular groove 95 which ensures that the hexagon smoothly abuts against the frame. To ensure proper centering, a portion 97 of the bushing which adjoins the groove 95 is constructed to be smooth. The bushing is provided with a thread 99 which is separated from the smooth portion 97 by a narrowed portion 101. The bushing is provided with three coaxial circle-cylindrical bore 103, 105, and 107. The boring 105 has a diameter which equals the diameter of the tuning shaft 59. The borings 103 and 107 have diameters which exceed the diameter of the tuning shaft 59 so as to reduce the risk of jamming during sliding and rotation of the shaft 59. The boring 107 is proportioned such that control knobs 73 having a hollow stem can also be mounted. The stem can then freely slide in the boring 107 when the tuning shaft 59 is axially displaced.

The frequency selector (FIG. 1) is provided with a coarse tuning member which is operated by the button rod 3 and which is partly shown in diagrammatic form. The described tuning means are generally referred to as fine tuning means which together constitute a fine tuning assembly. The coarse tuning assembly comprises a wave length switch 109 of a commonly used type which is operated by means of a switching rod 111. The switching rod 111 is connected to a slide 113 which is provided with a first cam 115 which cooperates with a profiled disc 117 mounted on the turret shaft 29. A tensile spring 119 is connected to the slide 113. The slide 113 — made, for example, of synthetic material — is provided with a second cam 121 having a bevelled edge 123. The bevelled edge 123 co-operates with a bevelled edge 125 formed on the button rod 3. The profiled disc 117 has a number of radial ledges which correspond to the frequency ranges associated with given preselection frequencies which can be accurately adjusted in the tuning member 49 by means of the abutment screws on the turret. When the preselection tuning is changed, the button rod 3 is displaced by means of the control knob 7, with the result that the co-operating bevelled edges 123 and 125 displace the slide 113 to the right against the force of the tensile spring 119. As soon as the cam 115 is out of the reach of the profiled disc 117, the crank pin 21 engages the turret 25, and the latter is displaced one step simultaneously with the profiled disc. When the button rod 3 returns to its neutral position, the slide 113 is displaced to the left and the cam 115 occupies a position which corresponds to the radial ledge on the profiled disc 117. The profiled disc 117 may be provided with defined edges. However, it is alternatively possible to use a profiled disc having ledges which smoothly change over one into the other, and to have this disc continuously scanned by the cam 115. The cam 121 can then be dispensed with. The force required for operating the knob 7 then increases, because the rotation of the turret 25 takes place at the same instant as the displacement of the slide 113. So as to avoid an unacceptably high button pressure, use can be made of a profiled disc which is arranged on its own shaft and which is driven by the groove spindle 11. The profile of the disc can be designed such that the rotation of the turret 25 does not coincide with the displacement of the feeler following the profiled disc.

It is to be noted that for the described frequency selector — notably suitable as a station selector in car radios — the risk of unintended changing of the preselection is substantially reduced, in that any change of the preselection frequency automatically uncouples the fine tuning from the relevant control section What is claimed is 1. In a frequency selector comprising a first control member mounted for operational movement; a tuning assembly with pre-selection capability, including a tuning device, a plurality of adjustable members, means for mounting said adjustable members and for selecting one of said members in response to operational movement of said control member, and coupling means comprising a coupling member for controlling the tuning device in response to displacement of said coupling member by a selected one of said adjustable members; a second control member; means for positioning said second control member for movement between first and second stable positions, in said first stable position said second control member being engaged with said selected one of said adjustable members for fine adjustment motion of said selected member, and in said second stable position said second control member being disabled from engaging any of said adjustable members; and means for moving said second control member from said first to said second position in response to operational movement of said first control member,
   the improvement wherein said first and second control members and mounted for slidable translational movement along parallel paths for said operational movement and said movement between said first and second stable positions respectively, and said tuning assembly includes a coupling element slidable along a path parallel to said paths, said coupling element moving said second control member out of engagement in response to said operational movement of said first control member.

2. A frequency selector according to claim 1, wherein said tuning assembly comprises a turret mounted for stepwise rotation about an axis, said plurality of adjustable members comprises a respective plurality of adjustable abutment screws mounted on the turret with axes of the screws being parallel to the turret rotational axis, said coupling means being responsive to displacement of said coupling member according to axial position of a selected one of said abutment screws, said means for selecting one of said members comprises a selecting means shaft mounted parallel to said turret axis, crank pin means for intermittently rotating the turret stepwise in response to movement of said first control member by intermittent engagement of a crank pin in a profile on the turret, and means for rotating said shaft in response to operational movement of said first control member, said adjusting means comprises an adjusting gearwheel arranged to engage a toothed adjusting nut on the abutment screw of the selected adjustable member, and wherein said coupling element is a catching member connected to the first control member for moving said second control member axially from said first to said second stable positions.

3. A frequency selector as claimed in claim 2, wherein said first control member is slidably mounted on said shaft, said turret axis and shaft being parallel to said parallel paths, said second control member comprises a second shaft mounted for sliding axial motion parallel to said parallel paths, said second shaft having first and second circumferential grooves corresponding to said first and second stable positions, and said selector comprises a frame having resilient detent means mounted thereon for engaging said first groove while said second control member is in first stable position, and engaging said second groove while said second control member is in said second stable position.

4. A frequency selector as claimed in claim 3, comprising a bushing mounted in said frame having a bore whose axis is parallel to said turret axis, and a slot extending in a plane transverse to said bore axis, wherein said second control member shaft is slidable in said bore, and said detent means comprises, a wire spring arranged transversely to said second control member shaft and passing through said slot so as to engage a selected out of said grooves, said frame comprising projections at each side of said bushing for engaging free ends of the wire spring.

5. A frequency selector as claimed in claim 2 wherein said first control member comprises a slide arranged for translational motion along one path only; said coupling element is an extension of said slide; and said coupling member includes a second element movable translationally along a path parallel to said parallel paths into contact with said selected one member, a second extension of said slide engaging said second element to move it out of contact during said operational movement.

6. A frequency selector as claimed in claim 5, wherein said selecting means shaft is a rotatable guide shaft for said first control member slide, said crank pin being mounted on said guide shaft, said guide shaft having a helical groove engaged by a pin in said slide so arranged that sliding axial movement of said slide through one forward and one return stroke causes one revolution of said guide shaft.

* * * * *

UNITED STATES PATENT AND TRADEMARK OFFICE
CERTIFICATE OF CORRECTION

PATENT NO. : 4,043,207
DATED : August 23, 1977
INVENTOR(S) : EDDY JOHAN CLARISSE It is certified that error appears in the above-identified patent and that said Letters Patent are hereby corrected as shown below:

Claim 1: Col. 6, line 19, - "members and" should be

--members are--

Signed and Sealed this

Twentieth Day of December 1977

[SEAL]

Attest:

RUTH C. MASON
Attesting Officer

LUTRELLE F. PARKER
Acting Commissioner of Patents and Trademarks